United States Patent
Suzuki et al.

(10) Patent No.: US 8,140,129 B2
(45) Date of Patent: Mar. 20, 2012

(54) MOBILE PHONE TERMINAL AND COMMUNICATION SYSTEM

(75) Inventors: Katsuya Suzuki, Gunma (JP); Kuniharu Suzuki, Tokyo (JP); Akira Ikeuchi, Kanagawa (JP); Yoshihide Majima, Kanagawa (JP); Hirotsugu Iijima, Tokyo (JP); Kenichi Kasai, Kanagawa (JP); Takatoshi Itagaki, Hokkaido (JP)

(73) Assignees: Sony Ericsson Mobile Communications Japan, Inc, Tokyo (JP); Mitsumi Electric Co., Ltd., Tama-shi (JP)

( * ) Notice: Subject to any disclaimer, the term of this patent is extended or adjusted under 35 U.S.C. 154(b) by 550 days.

(21) Appl. No.: 12/262,625

(22) Filed: Oct. 31, 2008

(65) Prior Publication Data

US 2009/0124298 A1 May 14, 2009

(30) Foreign Application Priority Data

Nov. 9, 2007 (JP) ................................. 2007-292493

(51) Int. Cl.
*H04B 1/38* (2006.01)
(52) U.S. Cl. .................. 455/572; 455/573; 455/574
(58) Field of Classification Search .......... 455/572–574, 455/405, 423, 425, 127.5
See application file for complete search history.

(56) References Cited

U.S. PATENT DOCUMENTS

| | | | |
|---|---|---|---|
| 6,009,319 A * | 12/1999 | Khullar et al. ............... | 340/7.38 |
| 2002/0047797 A1 | 4/2002 | Mercke et al. | |
| 2006/0197492 A1* | 9/2006 | Wendelrup et al. ........... | 320/106 |
| 2007/0188150 A1* | 8/2007 | Yamaguchi et al. ........... | 320/136 |

FOREIGN PATENT DOCUMENTS

| | | |
|---|---|---|
| EP | 0 792 001 A2 | 8/1997 |
| EP | 0 792 001 A3 | 8/1997 |
| JP | 2002-536944 | 10/2002 |
| JP | 2007-58347 | 3/2007 |
| WO | WO 98/10609 | 3/1998 |
| WO | WO 00/45280 | 8/2000 |
| WO | WO 2007/041866 A1 | 4/2007 |

OTHER PUBLICATIONS

Office Action mailed Nov. 8, 2011, in Japanese Patent Application No. 2007-292493, filed Nov. 9, 2007.

* cited by examiner

*Primary Examiner* — Jean Gelin
*Assistant Examiner* — Michael Nguyen
(74) *Attorney, Agent, or Firm* — Oblon, Spivak, McClelland, Maier & Neustadt, L.L.P.

(57) ABSTRACT

Disclosed is a mobile phone terminal with a battery pack containing a retraceable battery as power supply, and transmitting and receiving radio-signals to and from a mobile phone system base transceiver station. The mobile phone terminal includes a data communication terminal communicating data with the battery pack, an intermittent receiving processor periodically carrying out intermittent receiving processing via the base transceiver station when the mobile phone terminal is in a standby operation, and a battery status determining unit transmitting, while the intermittent receiving processor is carrying out intermittent receiving processing, an activating signal to the battery pack via the data communication terminal and reading battery status data from the activated battery pack.

6 Claims, 8 Drawing Sheets

MOBILE PHONE TERMINAL AND COMMUNICATION SYSTEM

CROSS REFERENCES TO RELATED APPLICATIONS

The present invention contains subject matter related to Japanese Patent Application JP 2007-292493 filed in the Japanese Patent Office on Nov. 9, 2007, the entire contents of which being incorporated herein by reference.

BACKGROUND OF THE INVENTION

1. Field of the Invention

The invention relates to a mobile phone terminal to which an intelligent battery pack can be attached as power supply, and a communication system including the mobile phone terminal and the intelligent battery pack incorporated therein. Specifically, the invention relates to communication technology for a mobile phone terminal communicating with the battery incorporated therein.

2. Description of the Related Art

In battery packs incorporated in mobile phone terminals as a power supply, there is provided an intelligent battery pack capable of determining status of a rechargeable battery contained therein based on the self-gauged voltage, current, temperature and the like, and transferring such data to the mobile phone terminal via communication terminals. The intelligent battery pack sends self-gauged data, such as remaining battery capacity, to the mobile phone terminal at each of predetermined time intervals.

A serial interface is utilized for transmitting and receiving data between the intelligent battery pack and mobile phone terminal. Japanese Unexamined Patent Application Publication No. 2007-0058347 discloses a serial communications apparatus called Universal Asynchronous Receiver Transmitter (UART) known as an asynchronous serial communications circuit.

Asynchronous serial communication involves a communication system for synchronizing data communication between the intelligent battery pack and the mobile phone terminal. In this system, when there is no information, such as characters, to be sent, a stop bit is consecutively transmitted (normally, direct current voltage), whereas when there is, one bit is sent prior to each information that is subject to transmission. In this system, synchronous operation is not always required for data communication; that is, synchronous operation is only carried out upon request.

Japanese Unexamined Patent Application Publication No. 2007-0058347 discloses communication technology for reducing power consumption for a serial communication apparatus. The disclosed technology includes: consecutively supplying external clock signals; maintaining a standby status for receiving data while receiving no data; and generating a clock controller activating signal triggered by data reception so as to reduce power consumption for a serial communication apparatus.

SUMMARY OF THE INVENTION

UART technology disclosed in this publication is developed for personal computers; however, a mobile phone terminal can also employ UART technology as one method for communication with intelligent battery packs incorporated therein. It is preferable that consumption power be lower in the serial communication between an intelligent battery pack and the mobile phone terminal.

However, since in the related art UART communication technology, the communication clocks are continuously operated in PC, indicating that the communication clocks are also continuously operated in the mobile phone terminal for communicating with the battery. Accordingly, power consumption may not be low enough for the mobile phone terminal. While the mobile phone in standby status consumes several mA current, and the mobile phone during UART communication consumes approximately 1 mA current. This indicates that the current consumption in serial communication is not low enough to be trivialized in comparison to the standby current consumption. In general, a mobile phone terminal consumes longer time in standby status awaiting calls from a base transceiver station than in talking time while radio communicating with the base transceiver station. This implies that reducing power consumption of the mobile phone in standby status will be effective for elongating battery life. However, incorporating the intelligent battery pack in the mobile phone terminal has significantly increased current consumption, and has decreased the duration of standby status of the mobile phone.

Embodiments of the invention intend to provide a mobile phone terminal incorporating an intelligent battery pack therein and communication system in which power consumption of the battery is reduced.

An embodiment of the invention is applied to a mobile phone terminal with a battery pack containing a retraceable battery therein as power supply that transmits and receives radio-signals with a mobile phone system base transceiver station, and also applied to a communication system having the mobile phone terminal and battery pack incorporated therein. The mobile phone terminal includes a data communication terminal communicating data with the battery pack, an intermittent receiving processor periodically transmitting an activating signal to the battery pack via the data communication terminal simultaneously with intermittent receiving processing during standby operation, and a battery status evaluator reading battery status data from the battery pack activated.

In the mobile phone terminal having this configuration, since the mobile phone awaits call signals transmitted from the base transceiver station in a state where the mobile phone terminal can receive the signal in low power consumption, the mobile phone terminal in standby operation intermittently receives the signal at several seconds' intervals. While the mobile phone terminal is in standby operation, the mobile phone terminal activates the battery pack, communicates therewith to receive data such as the battery's status therefrom simultaneously with attempting to receive the signal from the base transceiver station. Accordingly, the mobile phone terminal can intermittently communicate with the battery pack while using the clock for receiving signals in standby operation of the mobile phone terminal.

According to an embodiment of the invention, when the mobile phone terminal receives the battery status data such as remaining battery capacity, since the mobile phone terminal utilizes the intermittent receiving intervals in receiving such data, the clock can be shared between intermittent receiving operation and communication operation with the intelligent battery pack. Thus, the current consumption of the mobile phone terminal can be lowered in comparison to the case where there is no sharing or collaboration between the two individual operations.

DESCRIPTION OF THE PREFERRED EMBODIMENTS

Embodiments of the invention will be described below with reference to FIGS. 1 to 9.

Figure 2:
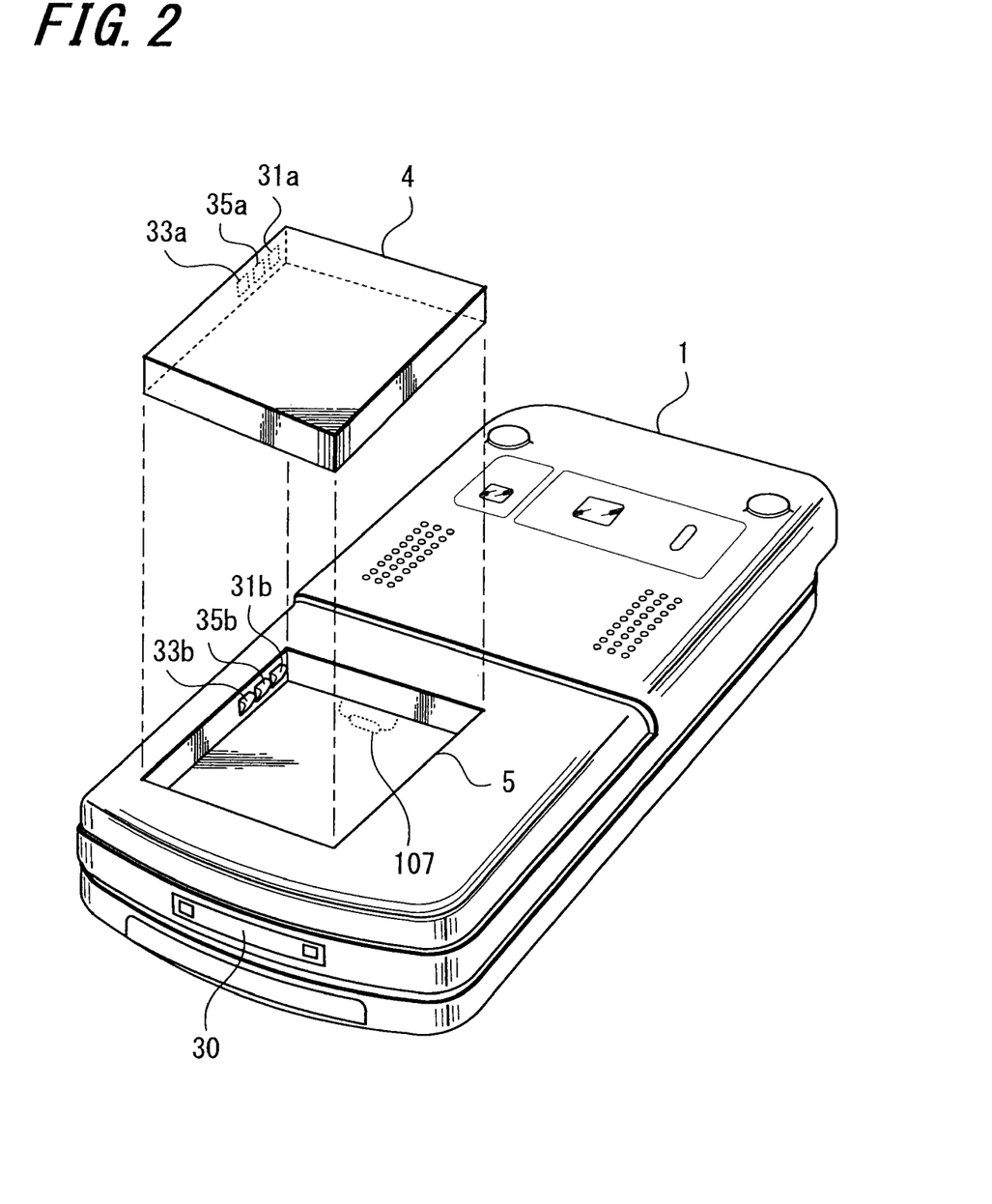
FIG. 2 is a perspective view illustrating a mobile phone terminal with intelligent battery pack being incorporated therein according to an embodiment of the invention.

FIG. 2 is a perspective view illustrating a configuration of a mobile phone terminal, to the back side of which an intelligent battery pack 4 is attached according to the embodiment of the invention.

In FIG. 2, a mobile phone terminal 1 includes a battery housing 5 for housing the intelligent battery pack 4 on the back surface thereof, and the battery housing 5 includes a battery plus terminal 31b, data communication terminal 35b, and battery minus terminal 33b for electrically connecting with the intelligent battery pack 4.

A thermistor 107 utilized as a temperature detector for gauging the temperature of the intelligent battery pack 4 is attached to the internal surface of the battery housing 5 of a mobile terminal case. An external power supply input terminal 30 is provided at the end surface of the mobile phone terminal case for connecting the mobile phone terminal 1 with an external power supply such as an AC adapter, though not shown in the figure.

The intelligent battery pack 4 includes a battery plus terminal 31a, data communication terminal 35a, and battery minus terminal 35a provided in locations corresponding to the battery plus terminal 31b, data communication terminal 35b, and battery minus terminal 33b of the battery housing 5 in the mobile phone terminal 1, respectively. When the intelligent battery pack 4 is housed in the battery housing 5 of the mobile phone terminal 1, the terminals are mutually brought into contact, thereby electrically connecting the intelligent battery pack 4 with the mobile phone terminal 1. A region around the battery housing 5 on the back surface of the mobile phone terminal 1 shown in FIG. 2 is covered with a battery cover, though not shown in the figure.

Next, an electrical connection between the intelligent battery pack 4 and the mobile phone terminal 1 when the intelligent battery pack 4 is housed in the battery housing 5 of the mobile phone terminal 1 is described with reference to to the block diagram of FIG. 1. The mobile phone terminal 1 shown in FIG. 1 merely depicts components relating to the control of the battery pack 4, and communication circuits or the like thereof for radio communication required as a mobile phone terminal are omitted.

Figure 1:
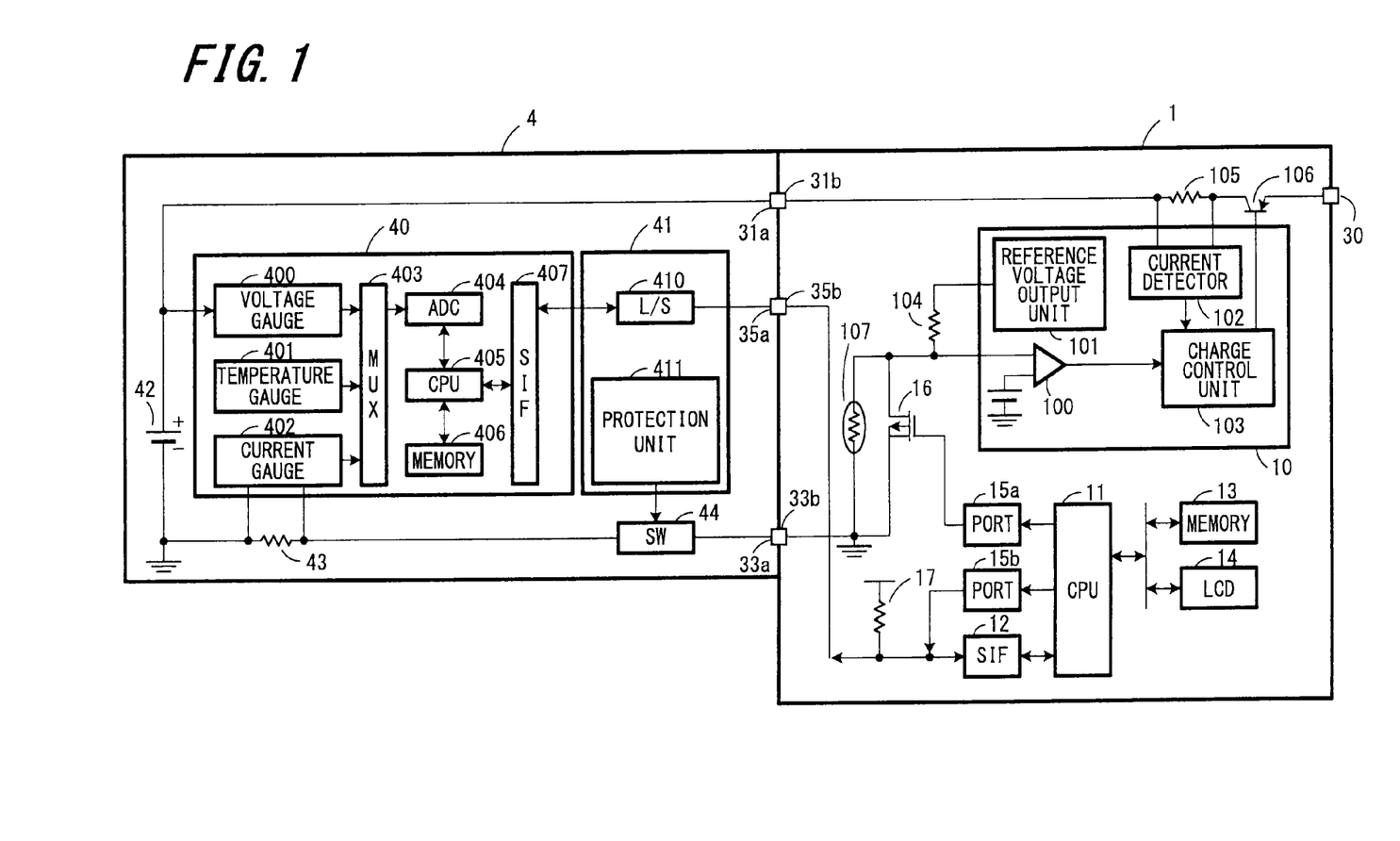
FIG. 1 is a block diagram illustrating an electric connections configuration between a mobile phone terminal and an intelligent battery pack according to an embodiment of the invention.

As shown in FIG. 1, the intelligent battery pack 4 includes a battery cell 42 formed of a rechargeable battery, and the battery plus terminal 31a is connected to a positive electrode of the battery cell 42. A negative electrode of the battery cell 42 is connected to a battery minus terminal 33a via a current detecting resistor 43 and a switch 44. An example of the rechargeable battery forming the battery cell 42 includes a lithium-ion rechargeable battery.

The intelligent battery pack 4 further includes a fuel gauge processor (hereinafter referred to as "FG processor") 40 that gauges the voltage, current, and temperature of the battery cell 42. The intelligent battery pack 4 still further includes a protection processor 41 that transfers the data from FG processor 40 to the mobile phone terminal 1, and also controls the switch 44. FG processor 40 and protection processor 41 may each be formed as an integrated circuit (IC).

FG processor 40 includes a voltage gauge 400 gauging the voltage of the battery cell 42, a temperature gauge 401 gauging the temperature of the battery cell 42, a current gauge 402 gauging the current flown in the current gauging resistor 43.

The results obtained by the voltage gauge 400, temperature gauge 401, and current gauge 402 are supplied to an analog-to-digital converter (hereinafter referred to as "ADC") 404 via a multiplexer (MUX) 403. For example, the results obtained by the voltage gauge 400, temperature gauge 401, and current gauge 402 are each supplied in time-division from the multiplexer 403 to ADC 404. The data converted by ADC 404 is transferred to a control processing unit (CPU) 405 described later. The data obtained by CPU 405 is transferred to a serial interface (hereinafter referred to as "SIF") 407 for data communication. CPU 405 operating as a communication control unit in the intelligent battery pack 4 controls data communication with the mobile phone terminal 1, and also controls the supply of clock signals to activate circuits such as FG processor 40 in the intelligent battery pack 4. Specifically, FG 40 includes a clock generating circuit, not shown, so as to generate several MHz clock signals and activate components of FG processor 40 in normal operation (running). Further, FG processor 40, in non-operation (not running), generates several tens kHz clock signals that have substantially lower frequency than the clock signals in normal operation, so that FG processor 40 can carry out minimal operation such as reactivation of the components thereof from non-operation status.

CPU 405 computes remaining battery capacity based on the data obtained from ADC 404. Memory 406 stores software including arithmetic algorithm for computing the remaining battery capacity or data converted into digital by ADC 404.

The protection processor 41 includes a level converting circuit (L/S) 410 that converts the level of a digital signal transmitted from SIF 407 into a receivable level thereof by the mobile phone terminal 1 connected with the intelligent battery pack 4, and supplies the converted level of the signal to the data communication terminal 35a. The protection processor 41 includes a protection unit 411 that controls the switch 44. Specifically, the protection unit 411 turns OFF the switch 44 to carry out protection operation when abnormality is notified from FG processor 40 to the protection processor 41.

Next, a configuration of the mobile phone terminal 1 of the embodiment to which the intelligent battery pack 4 is attached will be described. The mobile phone terminal 1 has a series circuit formed of a charge current detecting resistor 105 and charge control transistor 106 connected between the external power supply input terminal 30 and the plus terminal 31b. The current detector 102 inside the charge processor 10 detects the current flowing in the charge current detecting resistor 105 and transfers the detected current data to the charge control unit 103. The charge control unit 103 controls a charge control transistor 106 based on the results obtained from the current detector 102 and temperature detector 100. A configuration of the temperature detector 100 detecting temperature will be described later.

When the mobile phone terminal 1 charges the battery pack 4, the charge processor 10 retains the charge control transistor 106 being ON. When the mobile phone terminal 1 stops charging of the battery pack 4, the charge processor 10 turns the charge control transistor 106 OFF to disconnect electric connection between the external input terminal 30 and the battery plus terminal 31b. When neither charge current detected nor temperature detected are normal, the mobile phone terminal 1 turns the charge control transistor 106 OFF to stop charging of the battery pack 4. In a case where the battery cell 42 of the intelligent battery pack 4 is a lithium-ion rechargeable battery, the charge processor 10 controls to fully charge or approximately fully charge the battery cell 42.

The temperature detector 100 in the mobile phone terminal 1 is configured to detect temperature using the thermistor 107 attached to the internal surface of the battery housing 5 of the mobile phone terminal 1 shown in FIG. 2.

As shown in FIG. 1, one end of the thermistor 107 is connected to the battery minus terminal 33b, and the other thereof is connected to one end of the voltage dividing resistor 104. The reference voltage is supplied from the reference voltage output unit 101 of the charge processor 10 to the other end of the voltage dividing resistor 104. The temperature detector 100 detects the voltage at a connection node between the thermistor 107 and the voltage dividing resistor 104. The temperature detector 100 determines whether the detected voltage value exceeds the threshold, and transfers the resulting data to the charge control unit 103. The charge control unit 103 determines whether the temperature of the battery pack 4 is normal based on the detected voltage value exceeding or not exceeding the threshold, and controls the charging of the battery pack 4.

A transistor 16 utilized as a switching device is connected in parallel with the thermistor 107. ON or OFF operation of the transistor 16 is controlled by a signal supplied via a port 15a from CPU 11 that controls operation of the mobile phone terminal 1. When the transistor 16 is turned ON, the thermistor 107 is forcefully short-circuited. The transistor 16 is turned OFF in normal state and turned ON only in abnormal state. When the transistor 16 is turned ON, CPU 11 controls the charge processor 10 to stop charging or discharging of the battery cell 42.

Next, a configuration in which CPU 11 controlling the operation of the mobile phone terminal 1 communicates with the intelligent battery pack 4 is described.

The data communication terminal 35b of the mobile phone terminal 1 is connected to SIF 12 as an interface for communicating with the intelligent battery pack 4 via data communication terminal 35a. The communication carried out by the mobile phone terminal 1 with the battery pack 4 via the data communication terminal 35b is UART communication using an asynchronous serial communication circuit, for example. The communication with the intelligent battery pack 4 is intermittently carried out via the data communication terminal 35b when the terminal 1 is at least in standby operation mode. However, the communication with the intelligent battery pack 4 is also intermittently carried out via the data communication terminal 35b when the terminal 1 is not in standby operation mode. These intermittent communications are controlled by CPU 11 that is a circuit (intermittent receiving processor) executing intermittent receiving processing. The communication in the intelligent battery pack 4 is controlled by CPU 405. Details of intermittent receiving processing will be described later.

A pull-up resistor 17 for adjusting the digital signal level of the data communication terminal 35b is connected between the data communication terminal 35b and SIF 12. A port 15b is also provided for outputting a signal that enables data communication via data communication terminal 35b, and outputs an appropriate signal by the control of CPU 11. SIF 12 incorporates a clock generating circuit, not shown.

As illustrated in FIG. 1, CPU 11 controlling operation of components of the mobile phone terminal 1 is connected to circuits via an internal bus inside the mobile phone terminal 1. For example, CPU 11 is connected to a memory 13 on which a computer program for controlling operation of the mobile phone terminal and various data are recorded, and controls reading of the recorded data from and writing data on the memory 13. CPU 11 also controls a liquid crystal display (LCD) 14 to display the data or the like. For example, the display 14 displays the remaining battery capacity, time of day, or incoming e-mail notification. The display 14 can also display abnormality of the battery.

Next, operation of the mobile phone terminal 1 when the intelligence battery pack 4 is attached to the mobile phone terminal 1 of the embodiment is described.

Processing example of serial communication between the mobile phone terminal 1 and the intelligent battery pack 4 is also described. The mobile phone terminal 1 is in standby status, awaiting call signals from the base transceiver station. While the mobile phone terminal 1 is in standby status, the charge processor 10 of the mobile phone terminal 1 is not in operation.

UART communication system is employed for serial communication and UART communication processor is incorporated in SIF 12 (serial interface) in FIG. 1. The communication between the mobile phone terminal 1 and intelligent battery pack 4 is specifically achieved by the communication between SIF 12 and L/S 410 incorporated in the protection processor 41 via data communication terminals 35a, 35b.

While the mobile phone terminal 1 is in standby status, the mobile phone terminal 1 intermittently transfers data, such as telephone numbers or ID numbers, to the nearest base transceiver station, and intermittently receives signals from the base transceiver station to notify the mobile phone terminal 1 of which base transceiver station's area the mobile phone terminal 1 is. This communication is hereinafter called "intermittent receiving processing". The intermittent receiving processor intermittently transmits and receives signals via the base transceiver station at predetermined cycles, such as at 2.56 sec cycles; that is, transmission or reception of 10 msec duration is carried out at 2.56 sec cycles.

Figure 3:
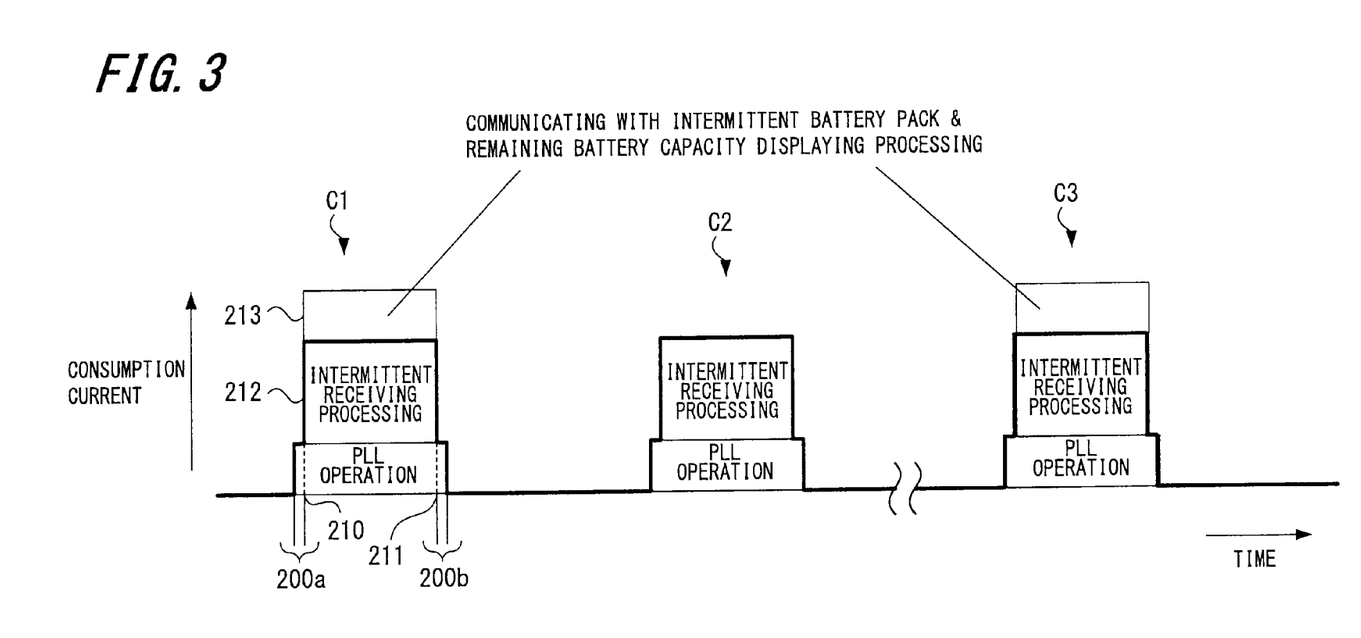
FIG. 3 is a time-chart illustrating an intermittent receiving processing in the mobile phone terminal according to an embodiment of the invention.

FIG. 3 is a time-chart illustrating an intermittent receiving processing in the mobile phone terminal 1. In this figure, a horizontal axis indicates time, and a vertical axis indicates current consumption. In FIG. 3, current in the mobile phone terminal 1 is consumed at intermittently receiving processing cycles C1 to C3. As shown in FIG. 3, when carrying out intermittent processing 212, a phase locked loop (PLL) circuit also needs operating for generating clock signals utilized for radio communication. Intermittent receiving processing including PLL circuit operation is hereinafter called "intermittent reception".

In intermittent receiving processing C1, C2, and C3, the PLL operation starts at the clock generating circuit of the mobile phone terminal 1. As shown in FIG. 3, PLL operation has started first, intermittent receiving processing 212 subsequently starts receiving radio-signals at a timing 210 when a predetermined time 200a has elapsed. The predetermined time 200a indicates duration from the time when the clock starts operating to the time when frequency thereof gets stabilized. When the intermittent receiving processing ends at a timing 211, PLL operation ends again after a predetermined time 200b has elapsed. One intermittent receiving duration from the time 210 to timing 211 is extremely short, such as approximately 10 msec. Although called "intermittent reception" duration, signals such as terminal location registration signals may also be transmitted in this duration. Intermittent receiving processing cycles C1, C2, C3 are predetermined by operating side of the mobile phone system. For example, one cycle may be 2.56 sec in such a mobile phone system.

The predetermined time 200b is used for ending PLL operation. Since ending of intermittent receiving processing and ending of PLL operation are not usually carried out at the same time, because PLL operation usually ends after the intermittent receiving processing has ended.

The mobile phone terminal 1 carries out communication 213 with the intelligent battery pack 4 during the operating interval that is between the start timing 210 and ending timing 211 of intermittent receiving processing 212. Specifically, CPU 11 of the mobile phone terminal 1 causes SIF 12 to operate based on the clock obtained as a result of PLL operation of intermittent receiving processing 212. Further, CPU 11 causes software stored on the memory 13 to operate, update the remaining battery capacity of the battery pack stored on the memory 13, and display the remaining battery capacity on a display unit LCD 14 as appropriate.

The cycle of intermittent receiving processing is relatively short cycle of approximately 2 seconds. However, since it is not so possible to rapidly change the battery consumption in such a short cycle, it may not be preferable that the mobile phone terminal 1 communicate with the intelligent battery pack 4 for every intermittent receiving processing. For example, the mobile phone terminal 1 may only have to communicate with the intelligent battery pack 4 once every several cycles to several tens of cycles. In an embodiment shown in FIG. 3, the mobile phone terminal 1 only communicates with the intelligent battery pack 4 at intermittent receiving processing cycles C1 and C3, but not at C2. The illustration of receiving processing an interval between C2 and C3 is omitted from FIG. 3.

The mobile phone terminal 1 has no communication 213 with the intelligent battery pack 4 at intermittent receiving cycle C2. After several times of intermittent receiving communications, the mobile phone terminal 1 communicates again with the intelligent battery pack 4 at intermittent receiving cycle 3.

Figure 4:
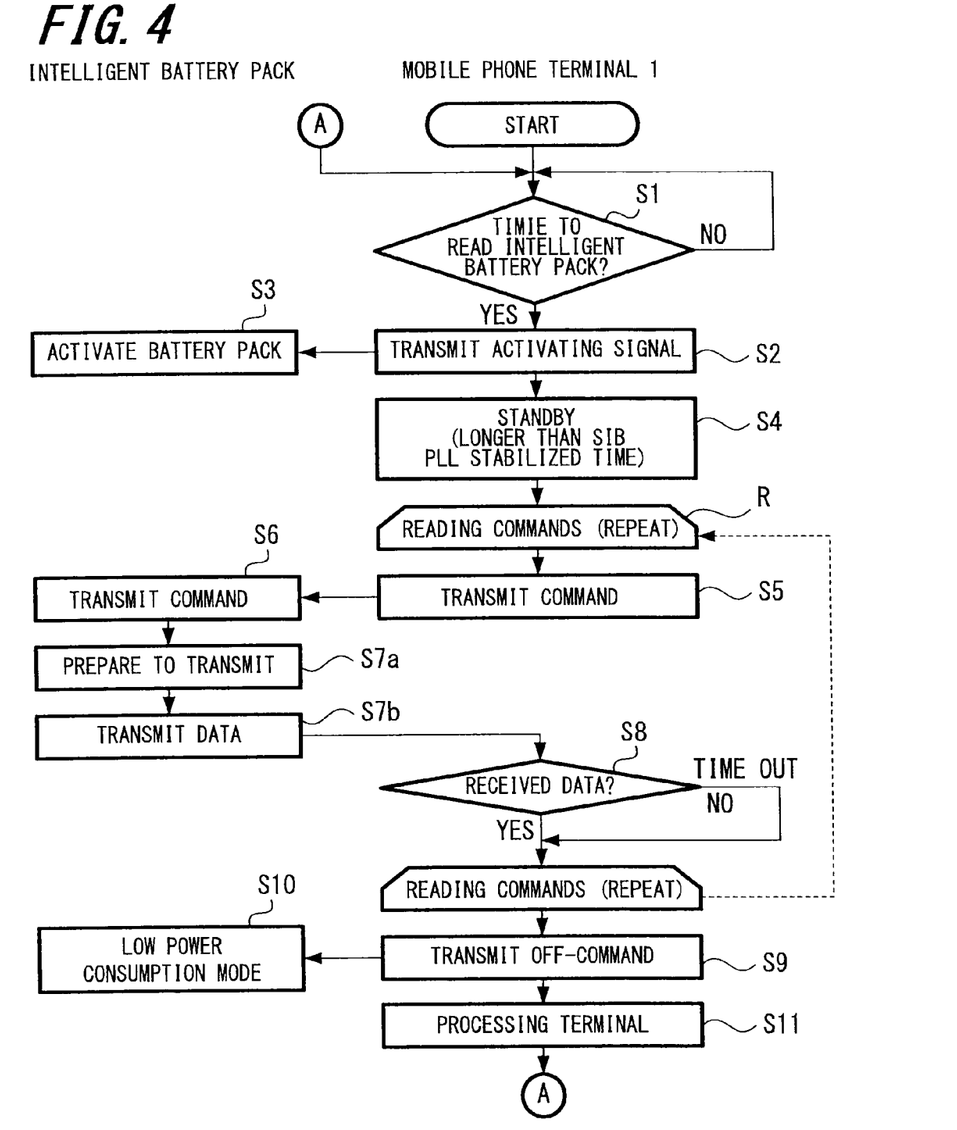
FIG. 4 is a flowchart illustrating processing in which the mobile phone terminal receives battery information, such as remaining battery capacity, from the intelligent battery pack according to an embodiment of the invention.

Next, a flowchart illustrating processing in which the mobile phone terminal 1 communicates with the intelligent battery pack 4 to obtain information on the remaining battery capacity during intermittent processing 212 is described. FIG. 4 is a flowchart illustrating processing in which the mobile phone terminal 1 receives battery information such as remaining battery capacity from the intelligent battery pack 4 according to an embodiment of the invention.

First, when the mobile phone terminal 1 is turned ON to initiate intermittent receiving processing; CPU 11 controls to execute processing of obtaining the remaining battery capacity. CPU includes a determination unit, transmitter, receiver, and the like that carry out processing of the flowchart described below. CPU 11 determines whether to update the battery information displayed on a liquid crystal display 14 of the mobile phone terminal 1 (step S1), and repeats step S1 when no updating the battery information is needed. S1 is determining processing to determine whether the timing of starting processing falls in an interval of intermittent receiving processing 212.

If the timing is determined as to update the battery information, CPU 11 generates an activating signal via port 15b and transmits the signal to the intelligent battery pack 4 via data communication terminal 35b (step S2).

High level voltage (e.g., 3.7 V) is constantly output via port 15b, and low level voltage (e.g., 0.5 V) is output by the activating signal or the like. CPU incorporated in FG processor 40 of the intelligent battery pack 4 operates in the clock frequency, such as 32 KHz (hereinafter called "low-rate clock"), when the mobile phone terminal 1 is in standby status.

CPU 405 receives the low level signal from the intelligent battery pack 4 via SIF 407, CPU 405 switches the low-rate clock to the clock of, for example, 4 MHz (hereinafter called "high-rate clock") (step S3). Next, when the high-rate clock has started, CPU 11 is in standby status until the frequency of the clock is stabilized (step S4).

When the high-rate clock is stabilized, CPU 11 of the mobile phone terminal 1 transmits a command for displaying the remaining battery capacity to the intelligent battery pack 4 so as to obtain remaining battery capacity display data (step S5). When CPU 405 of the intelligent battery pack 4 receives the command for displaying the remaining battery capacity, CPU 405 prepares to transmit the remaining battery capacity display data stored on a memory 406 (step S7a), and then actually transmits the data to the mobile phone terminal 1 (step S7b).

Next, the mobile phone terminal 1 determines whether the intelligent battery pack 4 has received the data (step S8). When the mobile phone terminal has received the data, a different command processing R is executed. When the mobile phone terminal 1 has received no data after a predetermined time, the mobile phone terminal 1 determines the status as time-out and shifts to a different command processing. When the mobile phone terminal 1 receives invalid data due to communication error, a different command processing R is executed.

When the mobile phone terminal 1 has received all data, the mobile phone terminal 1 transmits OFF-command to the intelligent battery pack 4 (step S9), and transits the battery pack mode to the low power consumption mode (step S10).

Figure 5:
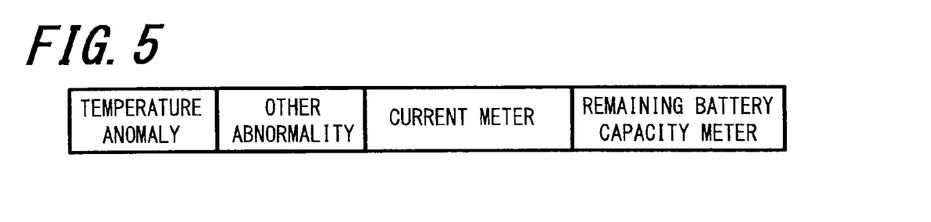
FIG. 5 is a configuration diagram illustrating a table of remaining battery capacity data according to the embodiment of the invention.

FIG. 5 shows a configuration example of remaining battery capacity display data obtained at S5 to S7b. FIG. 5 is a configuration diagram illustrating battery information (remaining battery capacity display data). The battery information contains four types of data: (1) "Temperature anomaly" indicating whether temperature of the intelligent battery pack 4 is in a range or out of range of normal temperature; (2) "other abnormality" indicating whether the battery cell 42 includes errors due to short-circuit other than temperature anomaly; (3) "current meter" indicating current value inside the intelligent battery pack 4; and (4) "remaining battery capacity meter" indicating the remaining battery capacity of the battery cell 42.

The mobile phone terminal 1 executes the aforementioned processing in the flowchart during intermittent receiving processing 212 (see FIG. 3); so that the current consumption due to communication with the intelligent battery pack 4 can be minimized.

According to the embodiment of the invention, the mobile phone terminal communicates with the intelligent battery pack 4 during intermittent receiving processing 212 as shown in FIG. 3. Since intermittent receiving processing 212 generally takes approximately 10 msec, the communication between the mobile phone terminal 1 and the intelligent battery pack 4 may not complete during that time.

Figure 6:
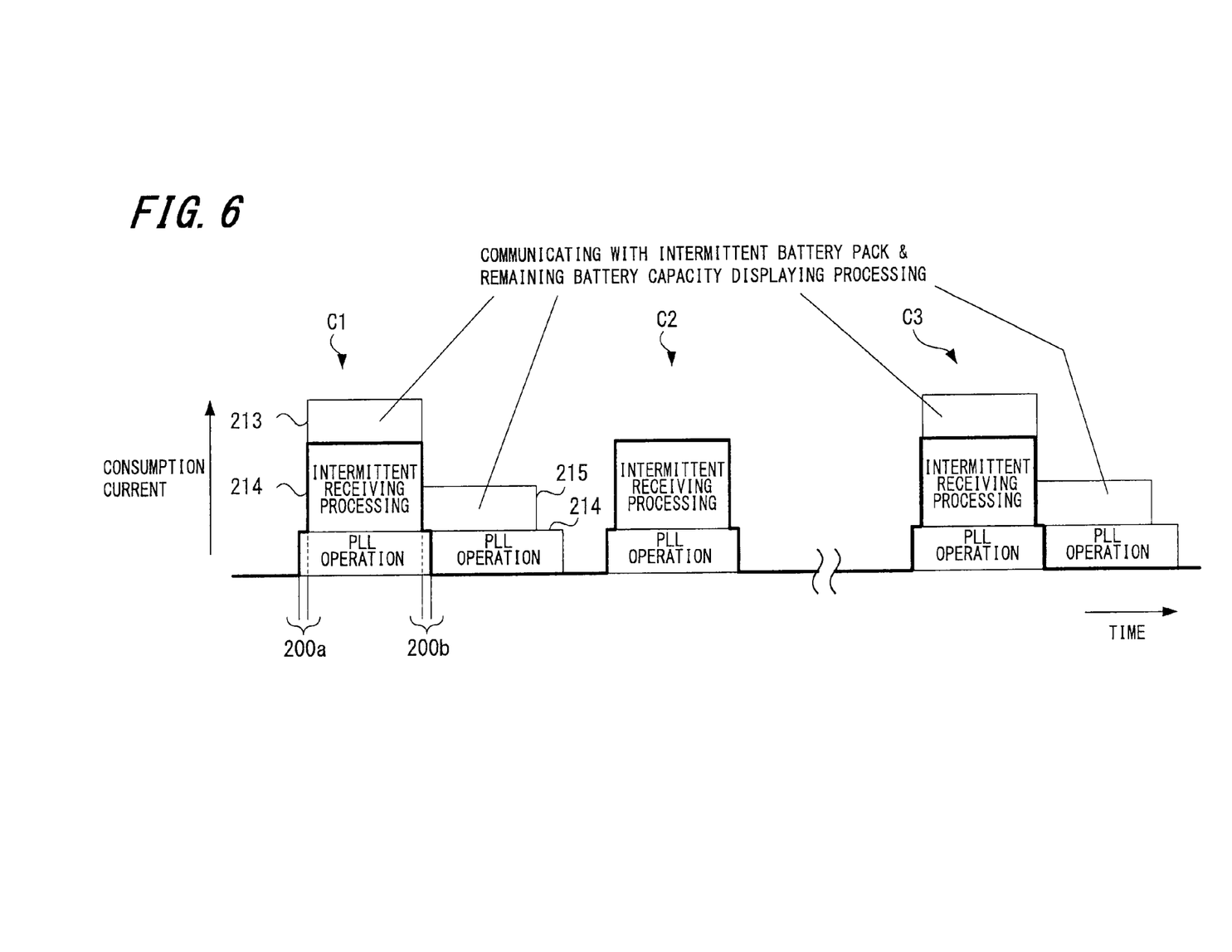
FIG. 6 is a time-chart illustrating an intermittent receiving processing in the mobile phone terminal according to a first modification of the embodiment.

Next, a first modification is described as one example in which the communication between the mobile phone terminal 1 and the intelligent battery pack 4 does not complete during intermittent receiving processing 212. FIG. 6 is a time-chart illustrating intermittent receiving processing 212 in the first modification.

In this figure, a horizontal axis indicates time, and a vertical axis indicates current consumption. Description of components identical to those illustrated in FIG. 3 is omitted. As shown in FIG. 6, the mobile phone terminal 1 carries out communication 213 with intelligent battery pack 4 during intermittent receiving processing 212. However, if the communication has not completed during the intermittent receiving processing 212, communication time is extended to continue the communication.

In other words, there are provided an extended duration 214 for intermittent receiving processing 212 of PLL operation and also an extended communication duration 215 for communicating with the intelligent battery pack 4. Extended PLL operation duration 214 subsequently ends when the extended duration 215 for communicating with the intelligent battery pack 4 has ended.

As similar to the first modification, even if the communication between the mobile phone terminal 1 and the intelligent battery pack 4 has not completed during intermittent receiving processing 212, when the mobile phone terminal 1 ends communication with the intelligent battery pack 4 during the extended communication duration 215, CPU 11 of the mobile phone terminal 1 immediately transmits OFF command to CPU 405 of the intelligent battery pack 4 to turn the mode of the intelligent battery pack 4 to the low power consumption mode. In this manner, current consumption in data communication can be minimized. Moreover, when the mobile phone terminal 1 ends communication with the intelligent battery pack 4 during the extended communication duration 215, CPU 11 also updates the remaining battery capacity display of the mobile phone terminal 1, and turns the mode of the intelligent battery pack 4 to the low power consumption mode, thereby minimizing current consumption in data communication.

It may not always be necessary for the mobile phone terminal 1 and the intelligent battery pack 4 to communicate each other during the intermittent receiving processing. As shown in FIG. 6, the mobile phone terminal 1 has no communication duration 213, 215 for communicating with the intelligent battery pack 4 at intermittent receiving cycle C2. However, the mobile phone terminal 1 has communication and also has extended communication with the intelligent battery pack 4 at intermittent receiving cycle C3. A flowchart illustrating processing in which the mobile phone terminal 1 communicates with the intelligent battery pack 4 is the same as that shown in FIG. 4.

Next, an intermittent processing example without having remaining battery capacity displayed on the display unit 14 of the mobile phone terminal 1 will be described. When a user is not using the mobile phone, nothing is displayed on the display unit 14. In this status, the mobile phone terminal 1 may not need to obtain information on the remaining battery capacity from the intelligent battery pack 4.

When the user carries out some operation to use the mobile phone terminal 1, the mobile phone terminal 1 starts obtaining the remaining battery capacity data from the battery pack 4, and subsequently obtains the remaining battery capacity data while carrying out the intermittent receiving processing 212.

Figure 7:
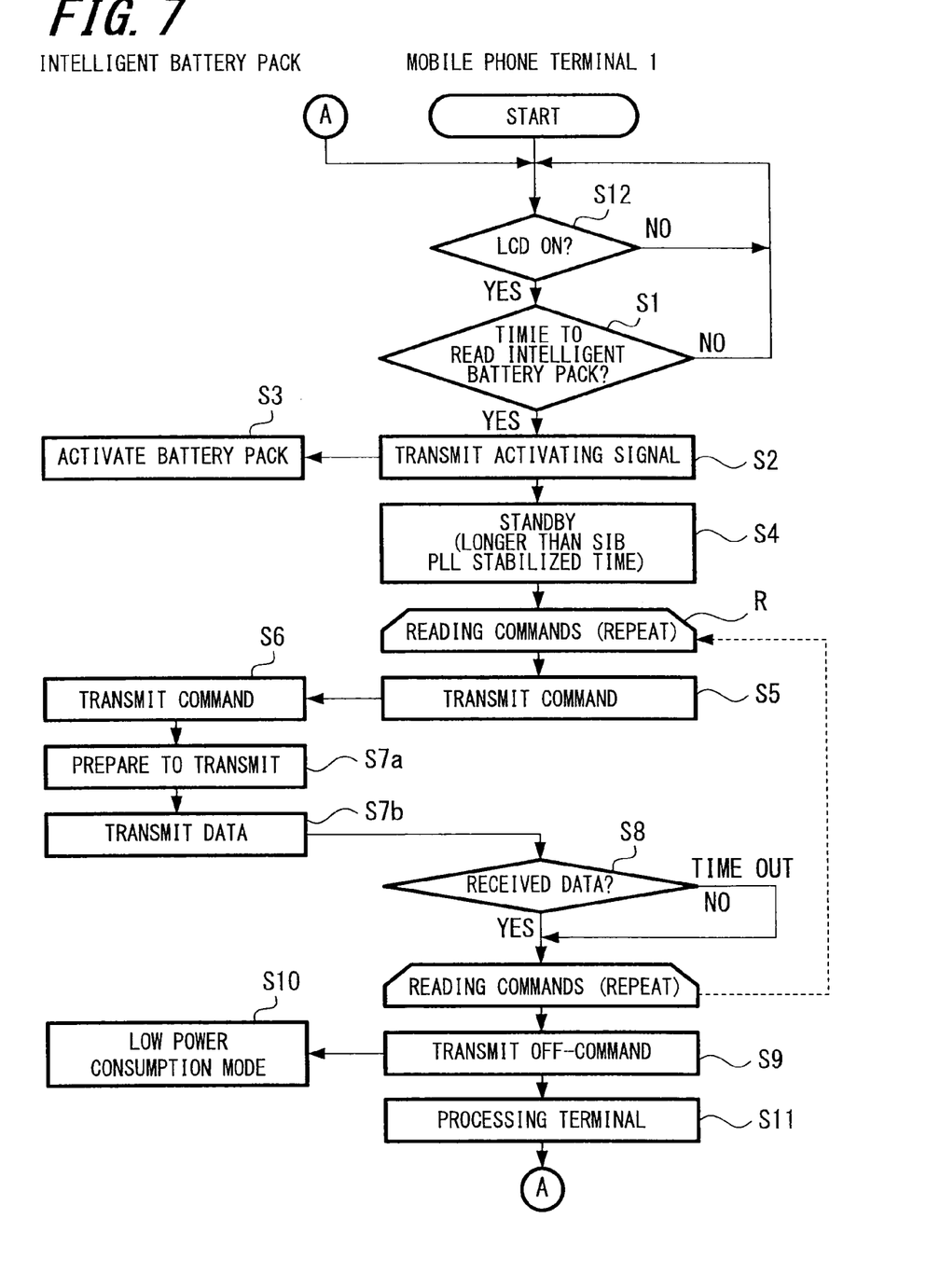
FIG. 7 is a flowchart illustrating processing in which the mobile phone terminal receives battery information, such as remaining battery capacity, from the intelligent battery pack in the mobile phone terminal according to a second modification of the embodiment.

FIG. 7 shows a second modification of a flowchart illustrating such processing of the mobile phone terminal 1. In a flowchart in FIG. 7, the processing steps identical to those of the flowchart in FIG. 4 are provided with identical step numbers.

As shown in FIG. 7, first, whether the liquid crystal display unit is turned ON is determined (step S12). If the display unit is OFF to indicate that the user is not using the mobile phone terminal 1, the mobile phone terminal 1 will not need obtaining the information on the remaining battery capacity from the intelligent battery pack 4.

Thus, if the status of the liquid crystal display unit is determined as ON to indicate "NO" at step S7, no further processing is carried out and step S12 is repeated. If the liquid crystal display unit is turned ON to indicate that the remaining battery capacity information needs to be displayed, step S1 is carried out to determine whether it is time to read information from the intelligent battery pack 4. Subsequent series of processing will be the same as those illustrated in FIG. 4, description thereof is thus omitted.

As described so far, since processing to determine the display status is carried out first, when the user is not using the mobile phone terminal 1, processing of obtaining information from the intelligent battery pack 4 will not be carried out even though the intermittent receiving processing 212 is carried out. Thus, current consumption of the mobile phone terminal 1 in standby status will be reduced.

Next, a third modification is described that is capable of, in addition to carrying out determination processing of whether the liquid crystal display unit 14 is on, outputting warning to the user that the battery pack needs charging upon request while monitoring the intelligent battery pack 4.

Figure 8:
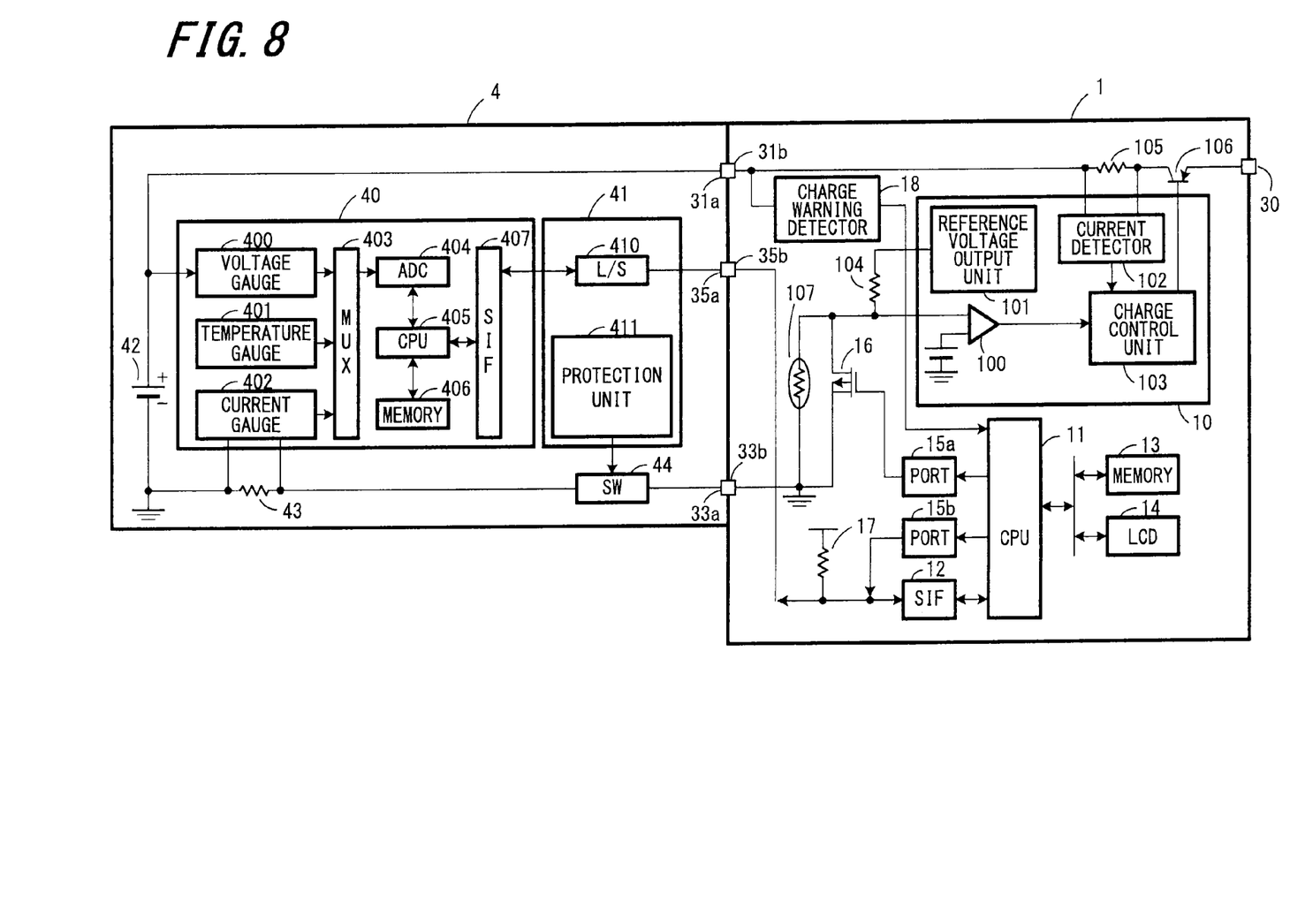
FIG. 8 is a block diagram illustrating electric connections between the mobile phone terminal and intelligent battery pack according to a third modification of the embodiment.

FIG. 8 is a block diagram illustrating electric connection configuration between the mobile phone terminal 4 and the intelligence battery pack 4 in the third modification. Components identical to those illustrated in FIG. 1 are provided with the same numerals of FIG. 1, and description thereof is omitted.

As shown in FIG. 8, the modification specifically includes a charge warning detector 18 connected between the battery plus terminal 31*b* and CPU 11. The charge warning detector 18 gauges the voltage of the battery cell 42 via the battery plus terminal 31*b*.

If the voltage of the battery cell 42 is detected as 3.7 V indicating the voltage in a normal operational range, there may be no need of charging the battery cell; however, if the voltage of the battery cell is detected as 3.1 V, the charge warning detector 18 transfers information to CPU 11, indicating that the battery cell needs charging. 3.7 V and 3.1 V are only used as examples for illustrating the voltage of the battery lower than the normal operational range thereof. Accordingly, the voltage is not limited thereto; and any voltages appropriately used for the mobile phone terminal 1 can be employed.

Figure 9:
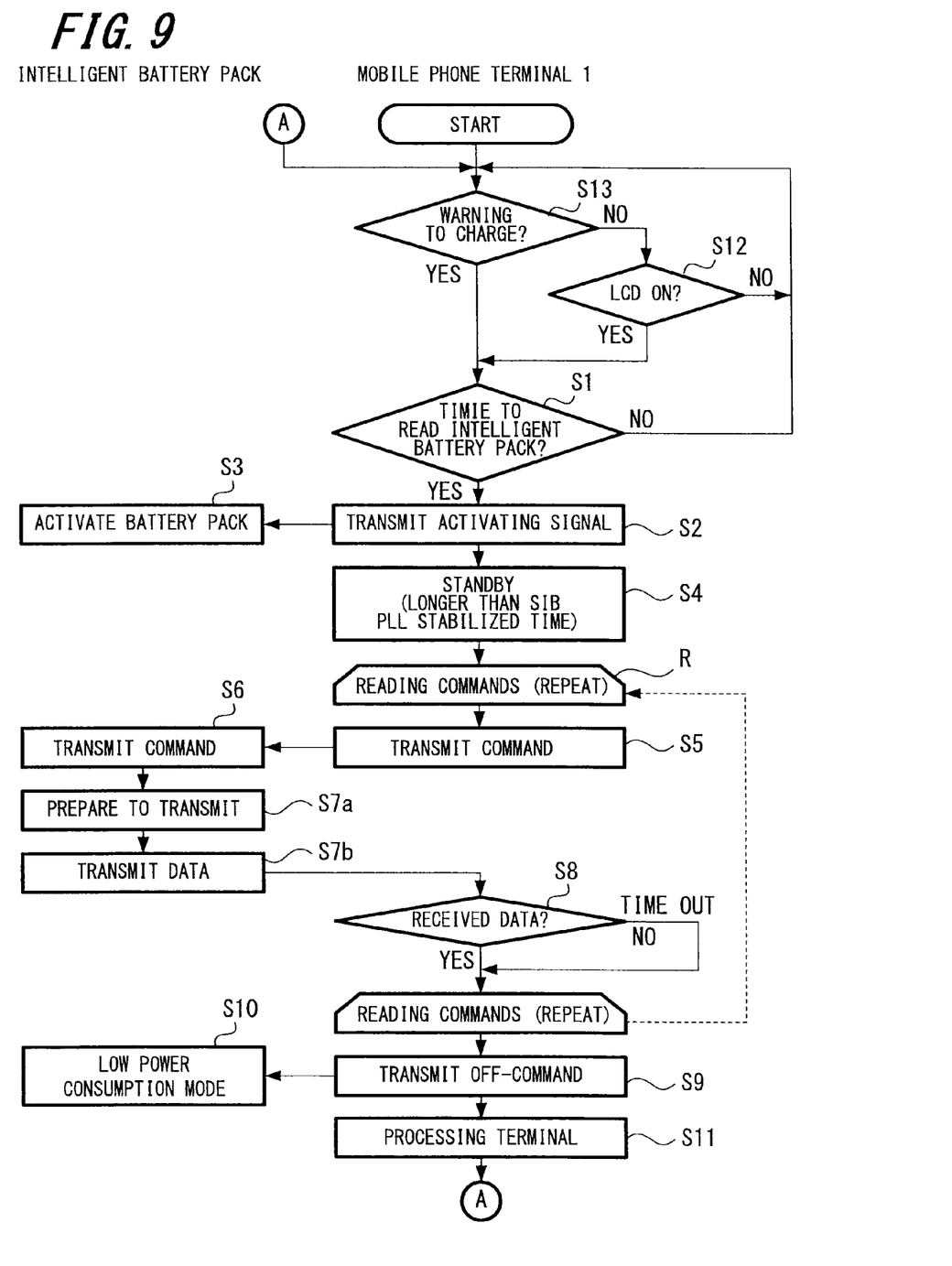
FIG. 9 is a flowchart illustrating processing in which the mobile phone terminal receives battery information, such as remaining battery capacity, from the intelligent battery pack in the mobile phone terminal according to the third modification of the embodiment.

Next, a flowchart of a computer program operated by CPU 11 in the third modification will be described with reference to FIG. 9. FIG. 9 is a block diagram illustrating electric connection configuration between the mobile phone terminal 1 and the intelligence battery pack 4 in the third modification.

Steps identical to those illustrated in the flowchart of FIG. 4 are provided with the same step numbers of FIG. 4, and description thereof is omitted. As illustrated in FIG. 9, whether charge warning needs displaying is determined based on the voltage first detected by the charge warning detector 18 (step S13). If the charge warning does not need displaying, step S12 is carried out to determine ON or OFF status of LCD 12. Steps subsequent to S12 are identical to those of the second modification, and description thereof is thus omitted.

If charge warning is determined as necessary at S13, whether it is time to read the intelligent battery pack 4 is determined at S1.

Steps subsequent thereto are identical to those of the flowchart in FIG. 4.

If charge warning is determined as necessary at S13, the mobile phone terminal 1 receives the remaining battery capacity display data from the intelligent battery pack 4 at S6 to S7*b*. Thus, CPU 11 of the mobile phone terminal 1 obtains more accurate data on the voltage of the battery cell from FG processor 40 incorporated in the intelligent battery pack 4.

The embodiments described so far are only examples of the configuration of the mobile phone incorporating a thermistor; and not limited thereto. In addition, the embodiments include a liquid crystal display as a display unit; however, other displays having different configuration can also be employed. Further, data on the battery status other than remaining battery capacity can be communicated between the mobile phone terminal 1 and the intelligent battery pack 4 via the data communication terminal. In the description above, data is intermittently communicated between the mobile phone terminal in conjunction with intermittent receiving operation cycles of the mobile phone terminal; however, data can intermittently be communicated therebetween in conjunction with similar cycles other than intermittent receiving operation cycles.

It should be understood by those skilled in the art that various modifications, combinations, sub-combinations and alterations may occur depending on design requirements and other factors insofar as they are within the scope of the appended claims or the equivalents thereof.

What is claimed is:

1. A mobile phone terminal with a battery pack containing a rechargeable battery as power supply, and transmitting and receiving radio-signals to and from a mobile phone system base transceiver station, the mobile phone terminal comprising:
    a data communication terminal communicating data with the battery pack;
    an intermittent receiving processor periodically carrying out intermittent receiving processing via the base transceiver station when the mobile phone terminal is in a standby operation; and
    a battery status determining unit transmitting, in response to determining the intermittent receiving processor is carrying out intermittent receiving processing based on a clock signal operation for communicating with the base station, an activating signal to the battery pack via the data communication terminal and reading battery status data from the activated battery pack, wherein
    the battery status determining unit transmits the activating signal to the battery pack only once every predetermined plural intermittent receiving cycles at the intermittent receiving processor.

2. The mobile phone terminal according to claim 1, wherein
    the battery status determining unit transmits, after having determined remaining battery capacity of the battery pack, an activation control signal to the battery pack via the data communication terminal to stop operation of the battery pack.

3. The mobile phone terminal according to claim 1, wherein
    the battery status determining unit determines remaining battery capacity based on the battery status data read from the battery pack, and updates stored data on a memory storing the determined remaining battery capacity.

4. The mobile phone terminal according to claim 3, further comprising:
    a display unit that displays the remaining battery capacity based on the stored data on the memory.

5. A communication system comprising:
    a mobile phone terminal transmitting and receiving radio-signals to and from a mobile phone system base transceiver station; and
    a battery pack containing a rechargeable battery installed in the mobile phone terminal as power supply:
    the battery pack including
    a communication unit determining a rechargeable battery status and transmitting determined battery status data to the mobile phone terminal, and
    a battery side data communication terminal through which data communication is carried out by the communication unit; and
    the mobile phone terminal including
    a terminal side data communication terminal carrying out data communication with the battery pack,
    an intermittent receiving processor periodically carrying out intermittent receiving processing with the base transceiver station while the mobile phone terminal is in a standby operation, and
    a battery status determining unit transmitting, in response to determining the intermittent receiving processor is carrying out intermittent receiving processing based on a clock signal operation for communicating with the base station, an activating signal to the battery pack via the terminal side data communication terminal and reading battery status data from the activated battery pack, wherein
    the battery status determining unit transmits the activating signal to the battery pack only once every predetermined plural intermittent receiving cycles at the intermittent receiving processor.

6. A method for a mobile phone terminal with a battery pack containing a rechargeable battery as power supply, the mobile phone terminal transmitting and receiving radio-signals to and from a mobile phone system base transceiver station, the method comprising:
    periodically carrying out intermittent receiving processing, by an intermittent receiving processor, via the base transceiver station when the mobile phone terminal is in a standby operation;
    in response to determining the intermittent receiving processor is carrying out intermittent receiving processing based on a clock signal operation for communicating with the base station, transmitting, by a battery status determining unit, an activating signal to the battery pack via the data communication terminal; and
    reading, by a data communication terminal communicating data between the mobile phone terminal and the battery pack, battery status data from the activated battery pack wherein
    the transmitting the activating signal, by the battery status determining unit to the battery pack, is only once every predetermined plural intermittent receiving cycles at the intermittent receiving processor.

* * * * *